United States Patent
Jüngling

(10) Patent No.: US 6,466,738 B2
(45) Date of Patent: Oct. 15, 2002

(54) MATERIAL FOR AGING-RESISTANT CERAMIC VAPORIZERS

(75) Inventor: Thomas Jüngling, Kempten (DE)

(73) Assignee: Elektroschmelzwerk Kempten GmbH, Kempten (DE)

(*) Notice: Subject to any disclaimer, the term of this patent is extended or adjusted under 35 U.S.C. 154(b) by 0 days.

(21) Appl. No.: 09/818,291

(22) Filed: Mar. 27, 2001

(65) Prior Publication Data

US 2002/0044770 A1 Apr. 18, 2002

(30) Foreign Application Priority Data

Mar. 30, 2000 (DE) .......................... 100 15 850

(51) Int. Cl.⁷ .................. C23C 14/00; C04B 35/03
(52) U.S. Cl. .............................. 392/388; 501/94
(58) Field of Search ..................... 392/386, 388, 392/389; 118/726; 501/94, 96.1, 96.4, 98.4

(56) References Cited

U.S. PATENT DOCUMENTS

| | | | |
|---|---|---|---|
| 2,839,413 A | * 6/1958 | Taylor | 501/192 |
| 3,236,663 A | * 2/1966 | Grulke | 501/96.3 |
| 3,256,103 A | * 6/1966 | Roche et al. | 501/96.3 |
| 3,544,486 A | 12/1970 | Passmore | |
| 3,813,252 A | * 5/1974 | Lipp | 252/520.22 |
| 4,268,314 A | * 5/1981 | Montgomery | 501/96.3 |
| 4,514,355 A | * 4/1985 | Montogmery | 501/98.6 |
| 4,666,873 A | * 5/1987 | Morris, Jr. et al. | 501/96.4 |
| 5,266,263 A | * 11/1993 | Hunold et al. | 419/31 |
| 5,604,164 A | * 2/1997 | Montgomery et al. | 501/96.1 |
| 5,908,795 A | * 6/1999 | Nishio et al. | 501/96.4 |

FOREIGN PATENT DOCUMENTS

GB    2132 227    7/1984

* cited by examiner

*Primary Examiner*—Sang Paik
(74) *Attorney, Agent, or Firm*—Collard & Roe, P.C.

(57) ABSTRACT

A ceramic material is provided containing 45 to 55% by weight $TiB_2$ and 40.5 to 54.7% by weight BN and 0.1–1.5% by weight Ca in the form of a compound selected from the group consisting of the calcium oxides and calcium borates and mixtures thereof, which material contains from 0.2 to 3% by weight of a compound selected from the group consisting of the oxides, carbides and nitrides of the elements Al, Si, Zr, Ti and mixtures thereof.

10 Claims, 1 Drawing Sheet

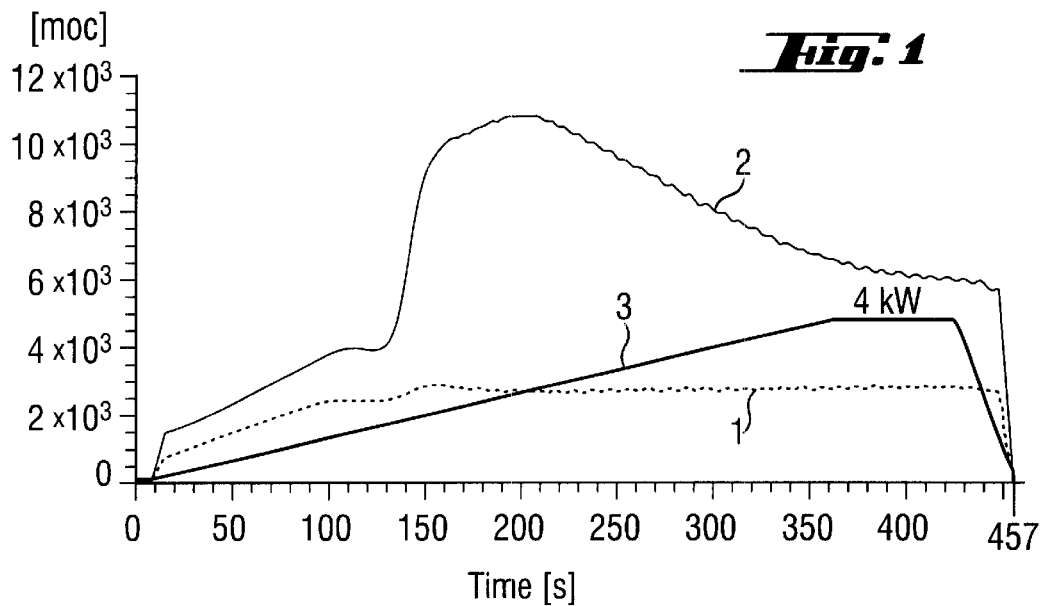
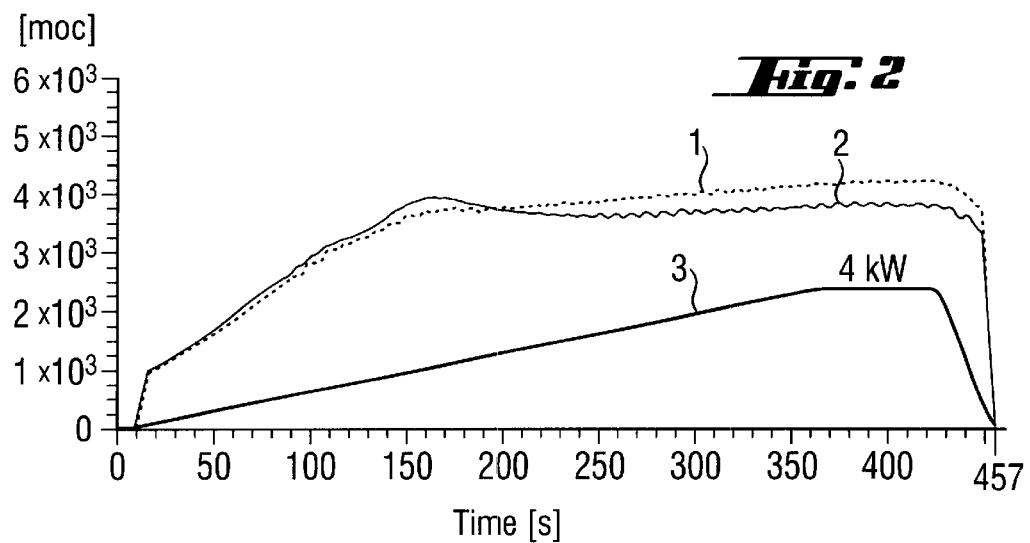

MATERIAL FOR AGING-RESISTANT CERAMIC VAPORIZERS

BACKGROUND OF THE INVENTION

FIELD OF THE INVENTION

The invention relates to a material for aging-resistant ceramic vaporizers.

The most widely used process for coating flexible substrates with metals, in particular with aluminum, is high-vacuum tape coating. In a metalization installation, the substrate to be coated is passed over a cooled roller and, as it does so, is exposed to the aluminum vapor, which is deposited on the substrate surface as a thin metal layer.

To generate the constant vapor stream required, ceramic vaporizers are heated to about 1450° C. by direct passage of electric current. Aluminum wire is continuously fed in, is liquefied on the ceramic surface and is vaporized at a vacuum of approximately $10^{-4}$ mbar.

In metalization installations, a series of vaporizers are arranged in such a way that a uniformly thick aluminum layer is deposited over the entire width of the tape. The vaporizers are held by cooled copper clamping jaws, both end-side and lateral clamping being possible.

The width and length of the vaporizer are selected according to the vaporization rate required (g Al min$^{-1}$). The usual cross section of vaporizers is rectangular. As well as vaporizers with a rectangular cross section, a range of other cross sections are also known. Details of these are to be found, for example, in U.S. Pat. No. 4,089,643 or DE 19823908 (corresponds to the U.S. application bearing Ser. No. 09/315,320).

The resistance R of the vaporizer in the electric circuit can be calculated from the geometry of the vaporizer and the electrical properties of the ceramic material (characterized by the resistivity $R_{spec}$) in accordance with equation (1).

$$R = R_{spec} \times L/A \quad L: \text{Length of the vaporizer}$$
$$A: \text{conductive cross section}$$

In the electric circuit, the vaporizer behaves as a metallic resistor, i.e. its resistance increases as the temperture rises. Therefore, it is additionally necessary to know the ratio between resistance at operating temperature (RHT) and the resistance at room temperature (RRT) in order to accurately characterize the electrical properties. For ceramic vaporizers, the ratio $R_{HT}/R_{Rt}$ is between 2.3 and 6.0.

A distinction is drawn between 2-component vaporizers (predominantly comprising $TiB_2$ as conductive phase and BN as insulator) and 3-component vaporizers (predominantly comprising $TiB_2$ as conductive phase and a mixture of BN and AlN as insulator), according to the number of principal components in the composition of the vaporizers in the 3-component vaporizer, AlN replaces some of the BN for economic reasons, since AlN is considerably less expensive. Therefore, in general the 3-component vaporizer contains 15–20% AlN. Such compositions are described, inter alia, in patents (e.g. U.S. Pat. No. 3,915,900, column 1, lines 10 and 11 and U.S. Pat. No. 4,089,643, column 2, line 5).

Since 2-component vaporizer materials have a lower high-temperature bending strength than 3-component vaporizer materials, they generally also contain 0.1–5% by weight CaO.

After production, 2-component vaporizers are generally packaged in bags made from metalized film, in order to protect the vaporizers from taking up moisture during transport or storage prior to use. This is because it has been found that 2-component vaporizer material is damaged in a characteristic way by the uptake of moisture. The damage becomes apparent from a strongly rising resistance during heating of the vaporizer, which takes place by the direct passage of current in metalization installations. In practice, this means that a vaporizer made from the damaged material cannot be heated in metalization installations, since its resistance is too high for conventional power supplies (10–15 volts secondary).

Despite this drawback, 2-component vaporizers are frequently used, since they can be operated at higher temperatures and can therefore reach vaporisation rates which are up to approximately +50% higher than 3-component vaporizers. Furthermore, they have a higher service life than 3-component vaporizers.

SUMMARY OF THE INVENTION

The object of the invention is to provide a ceramic material which is suitable for the production of 2-component vaporizers and is better able to withstand atmospheric humidity and is therefore more resistant to aging than known materials for 2-component vaporizers.

The object is achieved by a ceramic material containing 45 to 55% by weight $TiB_2$ and 40.5 to 54.7% by weight BN and 0.1–1.5% by weight Ca in the form of a compound selected from the group consisting of the calcium oxides and calcium borates and mixtures thereof, which material contains from 0.2 to 3% by weight of a compound selected from the group consisting of the oxides, carbides and nitrides of the elements Al, Si, Zr, Ti and mixtures thereof.

The present invention provides a process for producing a ceramic material, said ceramic material containing 45 to 55% by weight $TiB_2$ and 40.5 to 54.7% by weight BN; and 0.1–1.5% by weight of CaO; which material contains from 0.2 to 3% by weight of a compound selected from the group consisting of the oxides, carbides and nitrides of the elements Al, Si, Zr, Ti and mixtures thereof; comprising the steps of introducing from 0.2 to 3% by weight of said compound selected from the group consisting of the oxides, carbides and nitrides of the elements Al, Si, Zr, Ti and mixtures thereof, as a powder, in finely distributed form into a $TiB_2$/BN/CaO mixture to form a homogeneous powder mixture for 2-component vaporizers, and hot pressing said homogenous powder mixture in a graphite mold using ram pressure, at temperatures of at least 1800° C.

The present invention also provides a ceramic material comprising 45 to 55% by weight $TiB_2$ and 40.5 to 54.7% by weight BN and 0.1–1.5% by weight Ca in the form of a compound selected from the group consisting of the calcium oxides and calcium borates and mixtures thereof; which material contains from 0.2 to 3% by weight of a substance selected from the group consisting of
(1) a compound selected from the group consisting of the oxides, carbides and nitrides of the elements Si, Zr, and mixtures thereof; and
(2) a compound selected from the group consisting of the oxides, and carbides of the elements Al, Si, Zr, Ti and mixtures thereof.

The present invention further provides a process for producing a ceramic material,
said ceramic material containing 45 to 55% by weight $TiB_2$ and 40.5 to 54.7% by weight BN and 0.1–1.5% by weight CaO; which material contains from 0.2 to 3% by weight of a substance selected from the group consisting of
(1) a compound selected from the group consisting of the oxides, carbides and nitrides of the elements Si, Zr, and mixtures thereof; and
(2) a compound selected from he group consisting of the oxides, and carbides of the elements Al, Si, Zr, Ti and mixtures thereof; comprising the steps of
introducing from 0.2 to 3% by weight of said of compound selected from the group consisting of compound (1) and compound (2), in finely distributed form into a $TiB_2$/BN/CaO mixture to form a homogeneous powder mixture for 2-component vaporizers; and hot pressing said homogenous powder mixture in a graphite mold using ram pressure, at tempertures of at least 1800° C.

BRIEF DESCRIPTION OF THE DRAWINGS

FIG. 1 depicts the resistance curves as a function of time with a linear increase in power before and after storage for a conventional vaporizer.

FIG. 2 depicts the resistance curves as a function of time with a linear increase in power before and after storage for a vaporizer of the present invention.

DESCRIPTION OF THE PREFERRED EMBODIMENTS

The ceramic material preferably contains 0.2 to 1.5% by weight of a compound selected from the group consisting of the oxides, carbides and nitrides of the elements Al, Si, Zr, Ti and mixtures thereof.

The ceramic material particularly preferably contains 0.2 to 0.5% by weight of a compound selected from the group consisting of the oxides, carbides and nitrides of the elements Al, Si, Zr, Ti and mixtures thereof.

The compound selected from the group consisting of the oxides, carbides and nitrides of the elements Al, Si, Zr, Ti and mixtures thereof is preferably a compound selected from the group consisting of the nitrides of the elements Al, Si, Zr, Ti and mixtures thereof.

The compound selected from the group consisting of the oxides, carbides and nitrides of the elements Al, Si, Zr, Ti and mixtures thereof is particularly preferably AlN.

Particularly preferably, the material according to the invention consists of the above mentioned components.

The vaporizer material according to the invention does not differ from conventional 2-component vaporizer material in terms of its properties which are relevant for use (wetting with liquid aluminum, vaporisation rate at operating temperature, service life), but it does not present any time-dependent change in the materials properties. In particular, the resistivity does not change in the way which is known for 2-component vaporizer material.

The material according to the invention can be produced in the known way for conventional 2-component vaporizer materials. By way of example, production can take place by hot-pressing of homogenous powder mixtures in graphite molds using ram pressure, temperatures of at least 1800° C. being required in order to achieve solid bodies with sufficient density (U.S. Pat No. 4,528,120, column 1, lines 36–47).

The compounds selected from the group consisting of the oxides, carbides and nitrides of the elements Al, Si, Zr, Ti and mixtures thereof are introduced in finely distributed form into a conventional $TiB_2$/BN/CaO mixture. This preferably takes place as early as during mixing of the components mentioned first.

$TiB_2$ and BN are preferably used in the form of fine powders, as is known in the prior art (for example U.S. Pat. No. 4,528,120, column 5, table above Example 1).

The compounds selected from the group consisting of the oxides, carbides and nitrides of the elements Al, Si, Zr, Ti and mixtures thereof are preferably used as powders with a mean particle size of from 5 to 15 $\mu$m, preferably from 8 to 12 $\mu$m.

Such powders are commercially available, for example under the names SiC Grade UF-10, TiC High Vacuum 250, ZrC Grade A, AlN Grade A and Grade B, $Si_3N_4$ Grade B7 from H. C. Starck (Goslar). They can also be produced in a manner known per se from commercially available powders. For example, the AlN which is particularly preferably used can also be produced by nitriding of aluminum powders and subsequent comminution in, for example, ball mills.

The material according to the invention is particularly suitable for the production of vaporizers which are used to coat flexible substrates with metals. The production of the vaporizers from a block of the material according to the invention takes place as is known in the prior art. This may, for example, be carried out by sawing out the desired shape.

The invention thus also relates to vaporizers which consist of the ceramic material according to the invention.

The following example serves to explain the invention further:

EXAMPLES

Example 1
Production and Comparison of the Resistance to Aging of a Vaporizer According to the Invention (EV) and a Comparative 2-component Vaporizer (2K-VV) According to the Prior Art Homogenous powder mixtures of the following composition were produced:
2K-VV: 48% $TiB_2$, 51% BN, 1% CaO
EV: 48% $TiB_2$, 49.5% BN, 1% CaO, 1.5% AlN These homogenous powder mixtures were each compressed by axial, two-sided hot pressing in graphite molds at temperatures of >1800° C. and a pressure of >2; MPa, to form sintered bodies with a density of >95% of the theoretical density. In each case two vaporizers were machined out of the hot-pressed sintered bodies by means of band saws.

The vaporizers were rectangular, with a vaporizer geometry of 10×20×120 mm, which is customary for test purposes.

In each case one vaporizer according to the invention and one conventional vaporizer were heated by a linear increase in the power to a level of 4 kW. This power is necessary in order to reach the working temperature which is typical for vaporizers with the selected vaporizer geometry and material composition.

The other two vaporizers were initially stored for 12 hours in a desiccator at 100% atmospheric humidity before being heated as described above.

The results are shown in FIGS. 1 and 2, which illustrate the resistance curve as a function of time with a linear increase in power to a level of 4 kW (curve 3 in FIG. 1 and 2).

FIG. 1 shows the results for a conventional vaporizer (VV).

Curve 1 shows the measured curve of the resistance for the vaporizer which is heated immediately. The increase in resistance which is typical of undamaged material can be seen. The high-temperature resistance which is established for the selected power of 4 kW curve 3 is aprox. 2800 moc (μOhm cm).

Curve 2 shows the measured curve of the resistance for the material after prior storage for 12 hours in a desiccator under 100% atmospheric humidity at 20° C. It is clear that, as the power is increased, the resistance rises rapidly, reaching levels of >10,000 moc. A vaporizer of this type will fail in a conventional tape coating installation and has to be replaced.

FIG. 2 shows the results with the vaporizers according to the invention (EV).

Curve 1 shows the measured curve of the resistance for the vaporizer which is heated immediately. The increase in resistance which is typical of undamaged material can be seen. The high-temperature resistance which is established for the selected power of 4 kW curve 3 is approx 4200 moc (μOhm cm).

Curve 2 shows the measured curve of the resistance for the material after prior storage for 12 hours in a desiccator under 100% atmospheric humidity at 20° C. It is clear that after storage there is no damage corresponding to that which can be seen in FIG. 1.

Further tests (results not shown) have demonstrated that even extending the storage time to a few days does not cause any damage. The effect described is even achieved with lower additive levels of 0.3–0.5%.

Examples for vaporizer material containing <0.5% AlN. The vaporizers EV 2 to EV 6 were produced in a similar manner to that described in Example 1.

| Sintered body | AlN content [% by weight] | TiB$_2$ content [% by weight] | BN content [% by weight] | CaO content [% by weight] | High-temp. resistance before storage [moc] | High-temp. resistance after storage [moc] |
|---|---|---|---|---|---|---|
| EV 2 | 0.4 | 47.7 | 50.9 | 1.0 | 2725 | 2730 |
| EV 3 | 0.3 | 48.7 | 50.0 | 1.0 | 2470 | 2480 |
| EV 4 | 0.4 | 47.2 | 51.4 | 1.0 | 2830 | 2840 |
| EV 5 | 0.5 | 46.4 | 52.1 | 1.0 | 3380 | 3300 |
| EV 6 | 0.3 | 48.5 | 50.2 | 1.0 | 2290 | 2300 |

Example 2

Vaporisation Rate and Service Life of a Vaporizer According to the Invention Compared to Known Vaporizers A vaporizer according to the invention (EV1) and a commercially available 3-component vaporizer (3K-VV) of the same dimensions (commercially available under the name ESK-Trimet® from ESK, Kempten) and the 2-component in accordance with Example 1 (2K-VV) were in the test metalization installation under conditions (P<10–3 mbar; end-side clamping) power specified in Table 1. The measured on rate and service life are given in Table 1.

|  | Power [KW] | Vaporisation rate [g/mincm$^2$] | Service life [h] |  |
|---|---|---|---|---|
| EV | 4 | 0.35 | 10 |  |
| 2K-VV | 4 | 0.35 | 10 |  |
| 3K-VV | 3.2 | 0.25 | 9 | ← economic operation |
|  | 4 | 0.35 | 6 |  |
|  | 2.4 | 0.2 | 10 |  |

What is claimed is:

1. A ceramic material containing 45 to 55% by weight TiB$_2$ and 40.5 to 54.7% by weight BN and 0.1–1.5% by weight Ca in the form of a compound selected from the group consisting of the calcium oxides and calcium borates and mixtures thereof, which material contains from 0.2 to 3% by weight of a compound selected from the group consisting of the oxides, carbides and nitrides of the elements Al, Si, Zr, Ti and mixtures thereof.

2. The ceramic material as claimed in claim 1, which contains from 0.2 to 1.5% by weight of a compound selected from the group consisting of the oxides, carbides and nitrides of the elements Al, Si, Zr, Ti and mixtures thereof.

3. The material as claimed in claim 1, which contains from 0.2 to 0.5% by weight of a compound-selected from the group consisting of the oxides, carbides and nitrides of the elements Al, Si, Zr, Ti and mixtures thereof.

4. The material as claimed in claim 1, wherein the compound selected from the group consisting of the oxides, carbides and nitrides of the elements Al, Si, Zr, Ti and mixtures thereof is selected from the group consisting of the nitrides of the elements Al, Si, Zr, Ti and mixtures thereof.

5. The material as claimed in claim 4, wherein the compound selected from the group consisting of the nitrides of the elements Al, Si, Zr, Ti and mixtures thereof is AlN.

6. A vaporizer which consists of ceramic material as claimed in claim 1.

7. A process for producing a ceramic material, said ceramic material containing 45 to 55% by weight TiB$_2$ and 40.5 to 54.7% by weight BN; and 0.1–1.5% by weight of CaO;

which material contains from 0.2 to 3% by weight of a compound selected from the group consisting of the oxides, carbides and nitrides of the elements Al, Si, Zr, Ti and mixtures thereof; comprising the steps of introducing from 0.2 to 3% by weight of said compound selected from the group consisting of the oxides, carbides and nitrides of the elements Al, Si, Zr, Ti and mixtures thereof, as a powder, in finely distributed form into a TiB$_2$/BN/CaO mixture to form a homogeneous powder mixture for 2-component vaporizers, and hot pressing said homogenous powder mixture in a graphite mold using ram pressure, at temperatures of at least 1800° C.

8. The process as claimed in claim 7, wherein the compound selected from the group consisting of the oxides, carbides and nitrides of the elements Al, Si, Zr, Ti and mixtures thereof is used as a a powder with a mean particle size of from 5 to 15 μm.

9. A ceramic material comprising 45 to 55% by weight TiB$_2$ and 40.5 to 54.7% by weight BN and 0.1–1.5% by weight Ca in the form of a compound selected from the group consisting of the calcium oxides and calcium borates and mixtures thereof;

which material contains from 0.2 to 3% by weight of a substance selected from the group consisting of
(1) a compound selected from the group consisting of the oxides, carbides and nitrides of the elements Si, Zr, and mixtures thereof; and
(2) a compound selected from the group consisting of the oxides, and carbides of the elements Al, Si, Zr, Ti and mixtures thereof.

10. A process for producing a ceramic material, said ceramic material containing 45 to 55% by weight $TiB_2$ and 40.5 to 54.7% by weight BN and 0.1–1.5% by weight CaO;

which material contains from 0.2 to 3% by weight of a substance selected from the group consisting of
(1) a compound selected from the group consisting of the oxides, carbides and nitrides of the elements Si, Zr, and mixtures thereof; and
(2) a compound selected from the group consisting of the oxides, and carbides of the elements Al, Si, Zr, Ti and mixtures thereof; comprising the steps of introducing from 0.2 to 3% by weight of said compound selected from the group consisting of compound (1) and compound (2), in finely distributed form into a $TiB_2$/BN/CaO mixture to form a homogenous powder mixture for 2-component vaporizers; and hot pressing said homogenous powder mixture in a graphite mold using ram pressure, at temperatures of at least 1800° C.

* * * * *